US007876753B2

(12) United States Patent
Solomon et al.

(10) Patent No.: US 7,876,753 B2
(45) Date of Patent: Jan. 25, 2011

(54) IP MULTI-CAST VIDEO RING DISTRIBUTION AND PROTECTION

(75) Inventors: David Solomon, River Vale, NJ (US); Stephen J. Brolin, Livingston, NJ (US); Virgil Vladescu, Hillsdale, NJ (US)

(73) Assignee: Fujitsu Limited, Kawasaki (JP)

( * ) Notice: Subject to any disclaimer, the term of this patent is extended or adjusted under 35 U.S.C. 154(b) by 286 days.

(21) Appl. No.: 11/637,037

(22) Filed: Dec. 12, 2006

(65) Prior Publication Data

US 2007/0133533 A1    Jun. 14, 2007

Related U.S. Application Data

(60) Provisional application No. 60/749,577, filed on Dec. 13, 2005.

(51) Int. Cl.
*H04L 12/46* (2006.01)

(52) U.S. Cl. ........................................ 370/390; 370/406

(58) Field of Classification Search ................. 370/390, 370/395.51, 400, 401–406, 432
See application file for complete search history.

(56) References Cited

U.S. PATENT DOCUMENTS

| 4,046,193 | A | | 9/1977 | Dougherty |
| 4,557,225 | A | | 12/1985 | Sagues |
| 4,720,850 | A | | 1/1988 | Oberlander |
| 4,858,069 | A | | 8/1989 | Hughes |
| 5,105,336 | A | | 4/1992 | Jacoby |
| 5,280,191 | A | | 1/1994 | Chang |
| 5,636,215 | A | * | 6/1997 | Kubo et al. .................. 370/397 |
| 5,748,445 | A | | 5/1998 | North |
| 5,812,373 | A | | 9/1998 | Hwang |
| 5,812,528 | A | | 9/1998 | VanDervort |
| 5,825,621 | A | | 10/1998 | Giannatto |
| 5,829,514 | A | | 11/1998 | Smith |
| 5,831,830 | A | | 11/1998 | Mahler |

(Continued)

FOREIGN PATENT DOCUMENTS

KR    2004063453    7/2004

OTHER PUBLICATIONS

International Search Report and a Written Opinion issued on Oct. 31, 2008 in the corresponding International PCT/US2006/047374 application.

(Continued)

*Primary Examiner*—Pankaj Kumar
*Assistant Examiner*—Duc T Duong
(74) *Attorney, Agent, or Firm*—Hanify & King, P.C.

(57) ABSTRACT

An IP Video distribution and protection system provides lower cost by using a reduced number of expensive IP multi-cast router high-speed ports. A multi-cast data source comprises at least one multi-cast router and a multi-cast server. The data source is coupled to a plurality of multi-cast data destinations via a data distribution network comprising a first and a second ring. The data destinations are communicatively linked together in the first ring for data flow in one direction. The second ring network communicatively connects the data source to the last data destination in the first ring for data flow in a different direction though the destinations. Each destination includes switching elements enabling the destinations to provide data in either direction to end users linked to the respective data destinations.

8 Claims, 3 Drawing Sheets

U.S. PATENT DOCUMENTS

| | | | | |
|---|---|---|---|---|
| 5,867,494 | A * | 2/1999 | Krishnaswamy et al. | 370/352 |
| 5,867,495 | A * | 2/1999 | Elliott et al. | 370/352 |
| 5,953,207 | A | 9/1999 | Aakalu | |
| 6,002,585 | A | 12/1999 | Leeb | |
| 6,038,129 | A | 3/2000 | Falaki | |
| 6,047,002 | A * | 4/2000 | Hartmann et al. | 370/466 |
| 6,101,090 | A | 8/2000 | Gates | |
| 6,434,000 | B1 | 8/2002 | Pandolfi | |
| 6,532,088 | B1 * | 3/2003 | Dantu et al. | 398/43 |
| 6,621,818 | B1 * | 9/2003 | Szczepanek et al. | 370/389 |
| 6,671,818 | B1 | 12/2003 | Mikurak | |
| 6,789,191 | B1 | 9/2004 | Lapstun | |
| 6,972,959 | B2 | 12/2005 | Asai | |
| 6,985,467 | B2 | 1/2006 | Lomp et al. | |
| 7,020,111 | B2 | 3/2006 | Ozluturk et al. | |
| 7,046,679 | B2 * | 5/2006 | Sampath et al. | 370/395.53 |
| 7,085,281 | B2 | 8/2006 | Thomas et al. | |
| 7,095,611 | B2 | 8/2006 | Kunz | |
| 7,124,101 | B1 * | 10/2006 | Mikurak | 705/35 |
| 7,130,807 | B1 * | 10/2006 | Mikurak | 705/7 |
| 7,133,415 | B2 | 11/2006 | Zelig | |
| 7,154,755 | B2 | 12/2006 | Araujo | |
| 7,158,380 | B2 | 1/2007 | Green | |
| 7,245,628 | B2 | 7/2007 | Shi et al. | |
| 7,277,443 | B2 * | 10/2007 | Goode et al. | 370/400 |
| 7,283,519 | B2 | 10/2007 | Girard | |
| 7,322,850 | B2 | 1/2008 | Neer | |
| 7,376,136 | B2 | 5/2008 | Song | |
| 7,403,477 | B2 | 7/2008 | Takeuchi | |
| 7,428,211 | B2 * | 9/2008 | Yu | 370/223 |
| 7,492,719 | B2 | 2/2009 | Lim | |
| 7,512,147 | B2 * | 3/2009 | Sato et al. | 370/452 |
| 7,599,620 | B2 * | 10/2009 | Graves et al. | 398/51 |
| 2002/0059637 | A1 * | 5/2002 | Rakib | 725/119 |
| 2002/0085548 | A1 * | 7/2002 | Ku et al. | 370/386 |
| 2002/0141159 | A1 | 10/2002 | Bloemen | |
| 2002/0196792 | A1 | 12/2002 | McNeil | |
| 2002/0196811 | A1 | 12/2002 | Park | |
| 2003/0091267 | A1 | 5/2003 | Alvarez | |
| 2004/0064351 | A1 | 4/2004 | Mikurak | |
| 2004/0107169 | A1 | 6/2004 | Lowe | |
| 2004/0177161 | A1 * | 9/2004 | Hoang | 709/246 |
| 2004/0190548 | A1 | 9/2004 | Harel et al. | |
| 2004/0202470 | A1 | 10/2004 | Lim | |
| 2005/0008013 | A1 | 1/2005 | Jamieson et al. | |
| 2005/0013314 | A1 | 1/2005 | Lim | |
| 2005/0099949 | A1 | 5/2005 | Mohan et al. | |
| 2005/0100015 | A1 * | 5/2005 | Eubanks | 370/390 |
| 2005/0180749 | A1 | 8/2005 | Koley et al. | |
| 2005/0198247 | A1 | 9/2005 | Perry | |
| 2006/0098578 | A1 | 5/2006 | Mallya | |
| 2006/0120389 | A1 * | 6/2006 | Sampath et al. | 370/401 |
| 2006/0209825 | A1 | 9/2006 | Carroll et al. | |
| 2006/0285536 | A1 | 12/2006 | Gerard Pauwels | |
| 2007/0025370 | A1 | 2/2007 | Ghasem et al. | |
| 2007/0070997 | A1 | 3/2007 | Weitz et al. | |
| 2007/0109974 | A1 | 5/2007 | Cutillo et al. | |
| 2007/0136743 | A1 * | 6/2007 | Hasek et al. | 725/33 |
| 2007/0136777 | A1 * | 6/2007 | Hasek et al. | 725/114 |
| 2008/0068807 | A1 | 3/2008 | Horng | |

OTHER PUBLICATIONS

Final Office Action dated Mar. 29, 2010 received in U.S. Appl. No. 11/637,041.
Non-Final Office Action dated Feb. 24, 2010 received in U.S. Appl. No. 11/637,808.
Final Office Action dated Feb. 1, 2010 received in U.S. Appl. No. 11/637,807.
Non-Final Office Action dated Sep. 16, 2009 issued in U.S. Appl. No. 11/637,807.
Non-Final Office Action dated Jul. 23, 2009 issued in U.S. Appl. No. 11/637,041.
Non-Final Office Action dated May 7, 2009 issued in U.S. Appl. No. 11/637,023.
Final Office Action dated Dec. 3, 2009 issued in U.S. Appl. No. 11/637,023.
Non-Final Office Action dated Apr. 17, 2008 issued in U.S. Appl. No. 11/637,840.
Notice of Allowance dated Aug. 13, 2008 issued in U.S. Appl. No. 11/637,840.
Final Office Action dated Oct. 16, 2009 issued in U.S. Appl. No. 11/637,808.
Non-Final Office Action dated May 5, 2009 issued in U.S. Appl. No. 11/637,808.
Notice of Allowance dated Nov. 9, 2009 issued in U.S. Appl. No. 11/637,842.
Non-Final Office Action dated May 14, 2009 issued in U.S. Appl. No. 11/637,842.
Non-Final Office Action dated Apr. 2, 2009 issued in U.S. Appl. No. 11/637,807.
IEEE Std 802.3ad-2000, "Aggregation of Multiple Link Segments", Mar. 30, 2000, IEEE, all pages.
Paul Congdon, "Load Balancing Algorithms", Feb. 4, 1998, IEEE Aggregate Study Group, all pages.
Final Office Action dated Mar. 29, 2010 issued in U.S. Appl. No. 11/637,041.
Non-Final Office Action dated Feb. 25, 2010 issued in U.S. Appl. No. 11/637,808.
Final Office Action dated Feb. 1, 2010 issued in U.S. Appl. No. 11/637,807.
Non-Final Office Action dated May 18, 2010 received in U.S. Appl. No. 11/637,023.
Final Office Action dated Jul. 20, 2010 received in U.S. Appl. No. 11/637,808.
International Search Report recieved in PCT/US06/47379 dated Feb. 19, 2008.
Notice of Allowance dated Sep. 23, 2010 received in U.S. Appl. No. 11/637,808.
Non-Final Office Action dated Nov. 8, 2010 received in U.S. Appl. No. 11/637,023.
Non-Final Office Action dated Nov. 10, 2010 received in U.S. Appl. No 11/637,807.
Final Office Action dated Dec. 3, 2010 received in U.S. Appl. No. 11/637,023.

* cited by examiner

IP MULTI-CAST VIDEO RING DISTRIBUTION AND PROTECTION

CROSS-REFERENCE TO RELATED APPLICATIONS

This application claims the benefit of provisional application 60/749,577, filed Dec. 13, 2005, the entirety of which is incorporated herein by reference.

BACKGROUND OF THE INVENTION

1. Field of the Invention

The present invention relates a system and method for IP Video distribution and protection that is lower cost by using a reduced number of expensive IP multi-cast router high-speed ports.

2. Background of the Prior Art

Internet Protocol Television (IPTV) describes a system where a digital television service is delivered using the Internet Protocol over a network infrastructure, which may include delivery by a broadband connection. For residential users, IPTV is often provided in conjunction with Video on Demand and may be bundled with Internet services such as Web access and VoIP. IPTV is typically supplied by a broadband operator using a closed network infrastructure, or it may be delivered over the public Internet.

Typically, IPTV services are multi-cast, which is delivery of information to a group of destinations simultaneously by delivering the messages over each link of the network only once and by only creating copies when the links to the destinations split. IPTV is multi-cast using IP Multi-cast technology, which is the implementation of the multi-cast concept on the IP routing level. IP multi-casting is performed by multi-cast routers, which determine distribution paths for data traffic sent to a multi-cast destination addresses.

While a number of network architectures may be used to deliver IPTV, optical networks are particularly advantageous due to their high data traffic capacity. Popular optical network technologies include synchronous optical networks and passive optical networks. Common synchronous optical networking technologies include SONET and SDH technologies. Synchronous networking requires that the exact rates that are used to transport the data are tightly synchronized across the entire network. This synchronization system allows entire inter-country networks to operate synchronously, greatly reducing the amount of buffering required between each element in the network. Both SONET and SDH can be used to encapsulate earlier digital transmission standards, or used directly to support either ATM or so-called Packet over SONET/SDH (POS) networking.

Another architecture that may form at least a portion of a network used to deliver IPTV is a Passive Optical Network (PON). A PON is a point-to-multipoint, fiber to the premises network architecture in which unpowered optical splitters are used to enable a single optical fiber to serve multiple premises, typically 32. A PON consists of an Optical Line Termination (OLT) typically at the service provider's central office and a number of Optical Network Units (ONUs) near end users. A PON configuration reduces the amount of fiber and central office equipment required compared with point to point architectures. Downstream signals are broadcast to each premise sharing a fiber. Encryption is used to prevent eavesdropping; however, IP Multicast signals are NOT encrypted. Upstream signals are combined using a multiple access protocol, typically time division multiple access (TDMA). The OLTs "range" the ONUs in order to provide time slot assignments for upstream communication and to compensate for round-trip transmission delay differences between ONU's on a specific PON and the shared OLT Typically, synchronous optical networks and passive optical networks are both used together in the multi-cast of IPTV services. One problem that has arisen with such architectures is that they typically require the use of a large number of expensive high speed ports on the multi-cast routers, especially when protection paths are provided. A need arises for a technique by which IP Video distribution and protection can be provided that is lower cost by using a reduced number of expensive IP multi-cast router high-speed ports.

SUMMARY OF THE INVENTION

The present invention provides a system and method for IP Video distribution and protection that is lower cost by using a reduced number of expensive IP multi-cast router high-speed ports, while providing protection of video traffic A system for distributing multi-cast data traffic comprises a multi-cast data source, a plurality of multi-cast data destinations, and a data distribution network communicatively connecting one instance of a multi-cast data source to the plurality of multi-cast data destinations, the data distribution network comprising a first ring network communicatively connecting the multi-cast data source to a first one of the plurality of multi-cast data destinations, connecting each one of the plurality of multi-cast data destinations to a subsequent one of the plurality of multi-cast data destinations, and connecting a last one of the plurality of multi-cast data destinations to the $2^{nd}$ multi-cast data source, and a second ring network communicatively connecting the $2^{nd}$ multi-cast data source to the last one of the plurality of multi-cast data destinations, connecting each one of the plurality of multi-cast data destinations to a previous one of the plurality of multi-cast data destinations, and connecting the first one of the plurality of multi-cast data destinations to the $1^{st}$ multi-cast data source. The multi-cast data source may comprise at least one of a multi-cast router and a multi-cast server.

Each of the plurality of multi-cast data destinations may comprise a first network switch having an interface to the first ring network and the second ring network, an interface to a second network switch, and an interface to at least one optical network service unit, the first network switch operable to receive multi-cast data from the first ring network, transmit the received first ring network multi-cast data to the second network switch, and transmit the received first ring network multi-cast data to the at least one optical network service unit, and to receive multi-cast data from the second network switch, transmit the multi-cast data received from the second network switch to the second ring network, and transmit the multi-cast data received from the second network switch to at least one optical network service unit and the second network switch having an interface to the first ring network and the second ring network, an interface to the first network switch, and an interface to at least one optical network service unit, the second network switch operable to receive multi-cast data from the second ring network, transmit the received second ring network multi-cast data to the first network switch, and transmit the received second ring network multi-cast data to the at least one optical network service unit, and to receive multi-cast data from the first network switch, transmit the multi-cast data received from the first network switch to the first ring network, and transmit the multi-cast data received from the first network switch to the at least one optical network service unit.

Each of the plurality of optical network service units may comprise an interface to at least one passive optical network. The passive optical network may be a Gigabit passive optical network. The first and second ring networks may be 10 Gigabit Ethernet networks. The first and second network switches may be Ethernet switches. The interfaces to the first and second ring networks may be 10 Gigabit Ethernet interfaces.

DETAILED DESCRIPTION OF THE PREFERRED EMBODIMENTS

Figure 1:
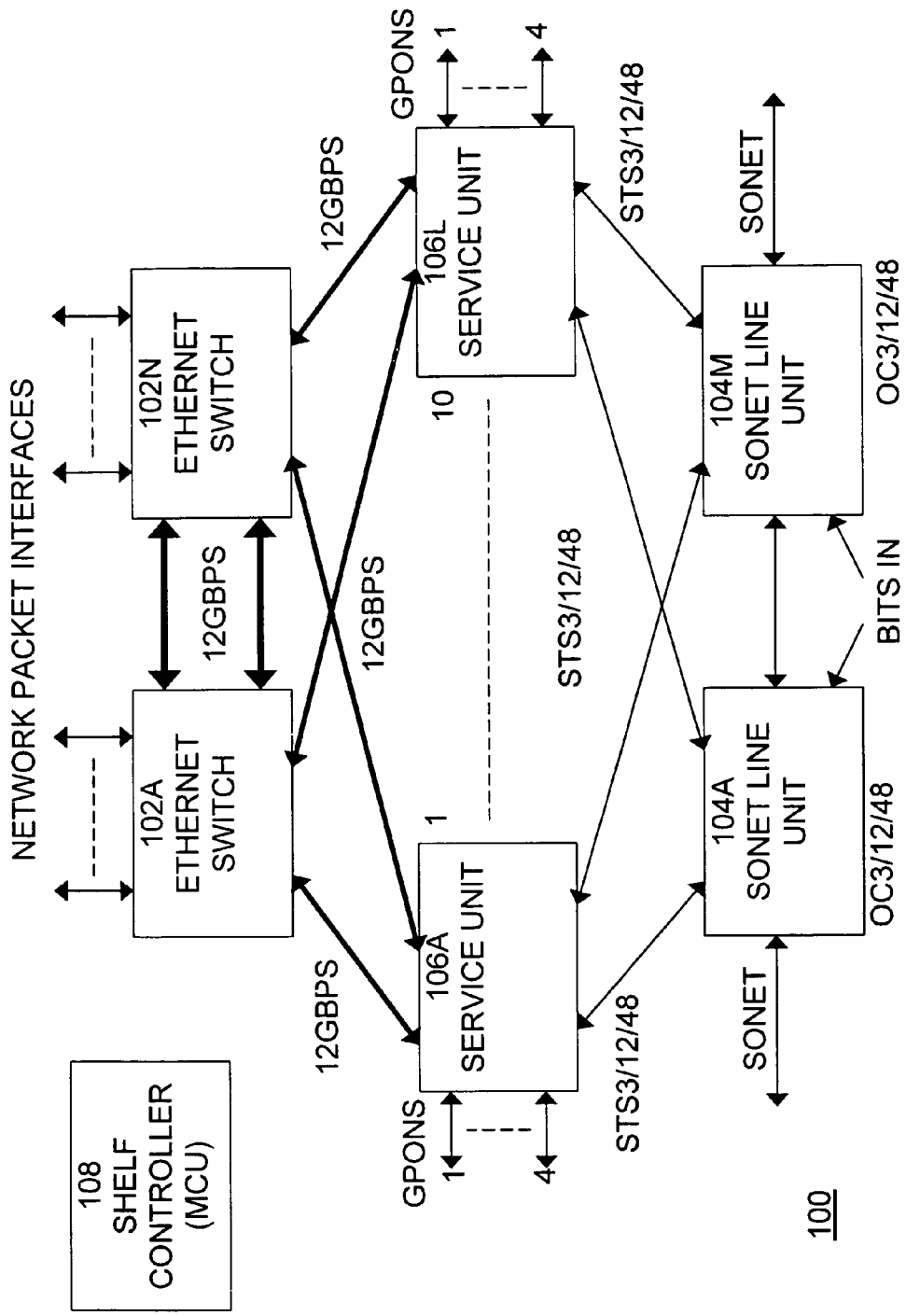
FIG. 1 is an exemplary block diagram of an Optical Line Terminal (OLT), in which the present invention may be implemented.

The present invention provides a system and method for IP Video distribution and protection that is lower cost by using a reduced number of expensive IP multi-cast router high-speed ports. Internet Protocol Television (IPTV) describes a system where a digital television service is delivered using the Internet Protocol over a network infrastructure, which may include delivery by a broadband connection. For residential users, IPTV is often provided in conjunction with Video on Demand and may be bundled with Internet services such as Web access and VoIP. IPTV is typically supplied by a broadband operator using a closed network infrastructure, or it may be delivered over the public Internet. The invention is primarily intended for the multi-cast segment of IPTV delivery.

Typically, IPTV services are multi-cast, which is delivery of information to a group of destinations simultaneously by delivering the messages over each link of the network only once and by only creating copies when the links to the destinations split. IPTV is multi-cast using IP Multi-cast technology, which is the implementation of the multi-cast concept on the IP routing level. IP multi-casting is performed by multi-cast routers, which determine distribution paths for data traffic sent to a multi-cast destination addresses. At the access level, IP multi-casting translated into Layer 2 multi-casting, which utilizes destination MAC addresses to determine content (Channel ID) and utilize as switching criteria.

While a number of network architectures may be used to deliver IPTV, optical networks are particularly advantageous due to their high data traffic capacity. Popular optical network technologies include synchronous optical networks and passive optical networks. Common synchronous optical networking technologies include SONET and SDH technologies. Synchronous networking requires that the exact rates that are used to transport the data are tightly synchronized across the entire network. This synchronization system allows entire inter-country networks to operate synchronously, greatly reducing the amount of buffering required between each element in the network. Both SONET and SDH can be used to encapsulate earlier digital transmission standards, or used directly to support either ATM or so-called Packet over SONET/SDH (POS) networking.

Another architecture that may form at least a portion of a network used to deliver IPTV is a Passive Optical Network (PON). A PON is a point-to-multipoint, fiber to the premises network architecture in which unpowered optical splitters are used to enable a single optical fiber to serve multiple premises, typically 32. A PON consists of an Optical Line Termination (OLT) at the service provider's central office and a number of Optical Network Units (ONUs) near end users. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, typically time division multiple access (TDMA). The OLTs "range" the ONUs in order to provide time slot assignments for upstream communication and equalize roundtrip transmission delays between the ONU's on a specific PON and the OLT There are a number of standard types of PON that have been implemented. APON (ATM Passive Optical Network) was the first Passive optical network standard. It was used primarily for business applications, and was based on ATM. BPON (Broadband PON) is a standard based on APON. It adds support for WDM, dynamic and higher upstream bandwidth allocation, and survivability. GPON (Gigabit PON) is an evolution of BPON. It supports higher rates, enhanced security, and choice of Layer 2 protocol (ATM, GEM, Ethernet). GPON represents a significant boost in both the total bandwidth and bandwidth efficiency through the use of larger, variable-length packets. A GPON network delivers up to 2,488 megabits per second (Mbit/s) of downstream bandwidth, and 2,488 Mbit/s of upstream bandwidth. GPON Encapsulation Method (GEM) allows very efficient packaging of user traffic, with frame segmentation to allow for higher Quality of Service (QoS) for delay-sensitive traffic such as voice and video communications.

The Internet Group Management Protocol (IGMP) is a communications protocol which constitutes the IP Multicast control plane, used to manage the membership of Internet Protocol multi-cast groups. IGMP is used by IP hosts and adjacent multi-cast routers to establish multi-cast group memberships. It is an integral part of the IP multi-cast specification. IGMP is used for online video and gaming, and allows more efficient use of resources when supporting these uses.

An example of an Optical Line Terminal (OLT)) 100, in which the present invention may be implemented, is shown in FIG. 1. Network 100 includes a plurality of switches, such as Ethernet switches 102A-N, a plurality of SONET line units 104A-M, a plurality of service units 106A-L, and shelf controller 108. The OLT 100 provides the interface between the customer's data, video, and telephony networks and the GPON. The primary function of the OLT 100 is to receive network traffic in either IP/Ethernet or SONET format and convert it ot the GPON standard for downstream traffic (towards the ONU) and to receive GPON traffic upstream and convert it to either IP/Ethernet or SONET format. ONU's at or near the end user convert the GPON format to end user's desired formats.

A network switch, such as an Ethernet switch 102A-N is a networking device that performs transparent bridging (connection of multiple network segments with forwarding based on MAC and/or VLAN addresses) at full wire speed in hardware. The use of specially designed hardware also makes it possible to have large numbers of ports.

SONET line units 104A-M (LUs), provide communication interface with the SONET network, while service units 106A-L (SUs), provide communication with the GPON networks. Each LU 104A-M typically provides timing control, SONET frame pulse reference, and may contain optical interfaces to transmit part of all of the SONET data on the GPON network to the SONET network, to supplement data fed directly to the OLT by the IP network. Downstream, the OLT can merge data from both the SONET and IP networks and feed to one or more GPON's. Upstream, the OLT receives data from one or more GPON's and can feed appropriate portions to the SONET and to the IP network.

Figure 2:
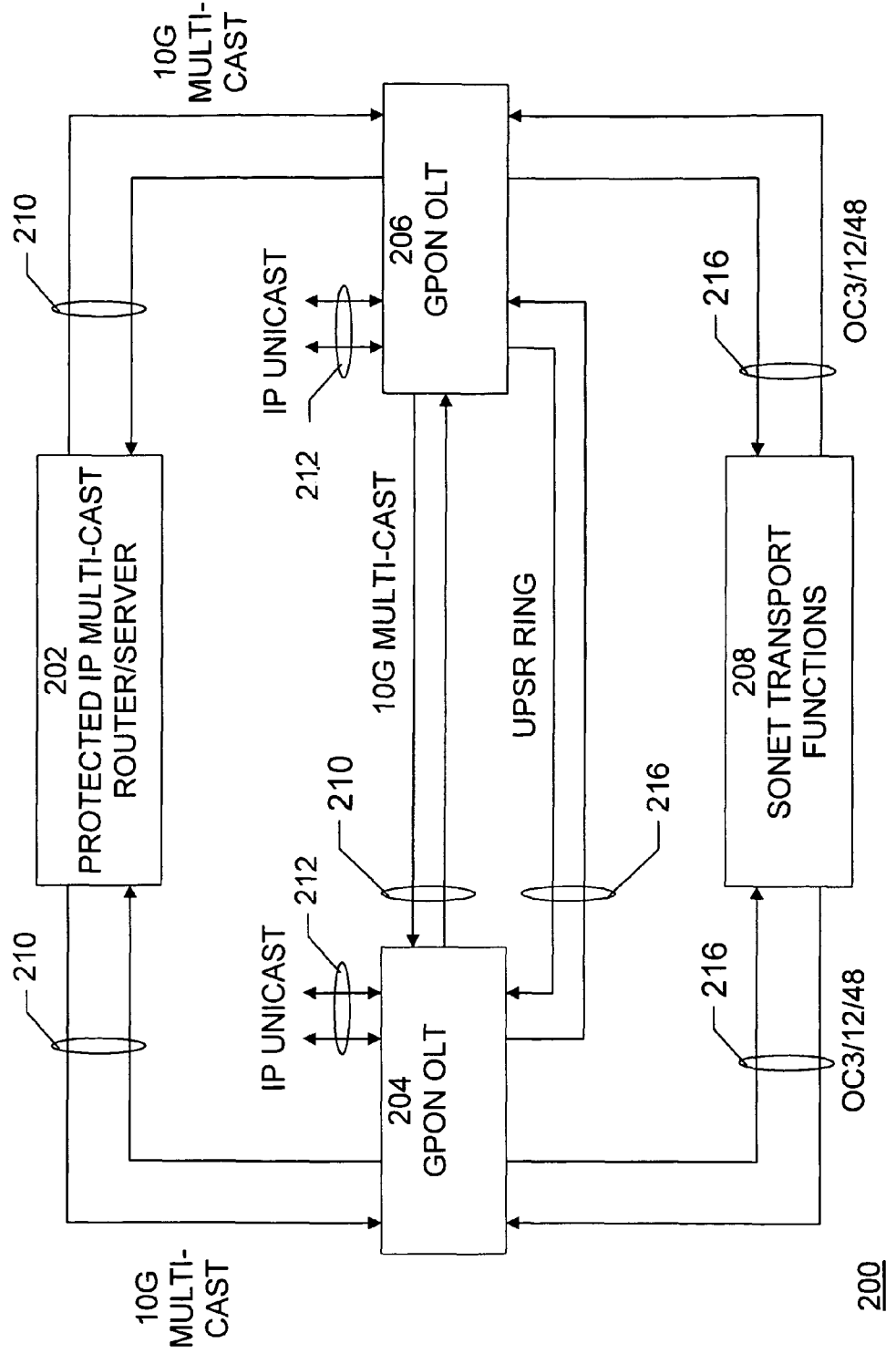
FIG. 2 is an exemplary block diagram of a network in which IP multi-cast video distribution may be implemented.

An exemplary block diagram of a system 200 in which IP multi-cast video distribution may be implemented is shown in FIG. 2. System 200 includes one or more IP multi-cast sources, such as IP multi-cast routers/servers 202, a plurality of GPON OLTs, such as GPON OLTs 204 and 206, and SONET transport functions 208. These elements are communicatively connected by a protected optical fiber ring 210. Protected optical fiber ring 210 typically includes at least two optical fibers, with data flowing in different directions around each fiber of the ring. Ring 210 may include multiple transport technologies, but typically is a single protocol for dedicated IP video rings. In the example shown in FIG. 2, IP multi-cast router/server 202 is communicatively connected to GPON OLTs 204 and 206 via 10 Gigabit Ethernet (10 GE), while SONET transport functions 208 are communicatively connected to GPON OLTs 204 and 206 via SONET transport channels, such as OC3, OC12, and/or OC48 SONET channels. In addition, GPON OLTs 204 and 206 may be connected to each other via communication channels such as 10 GE channels 214 and UPSR ring 216.

The IP multi-cast source may include one or more IP multi-cast routers, which route multi-cast data that is received to destination networks, and IP multi-cast servers, which store and transmit multi-cast data. The IP source, such as IP multi-cast router/server 202 multi-casts data, such as video content, over ring 210, to GPON OLTs 204 and 206. GPON OLTs 204 and 206, then continue the specific flows in the multi-cast chain from Ethernet Switch to Service Unit, down to the GPON's. In addition, the multi-cast data may be communicated to or by SONET transport functions 208; here also, the multi-cast chain is continued downstream via Ethernet Switch to Service Unit, and down to the GPON's. In addition to IP multi-cast, the Ethernet Switch receives IP unicast for other services and sends specific flows to Service Units and then to GPON's.

Figure 3:
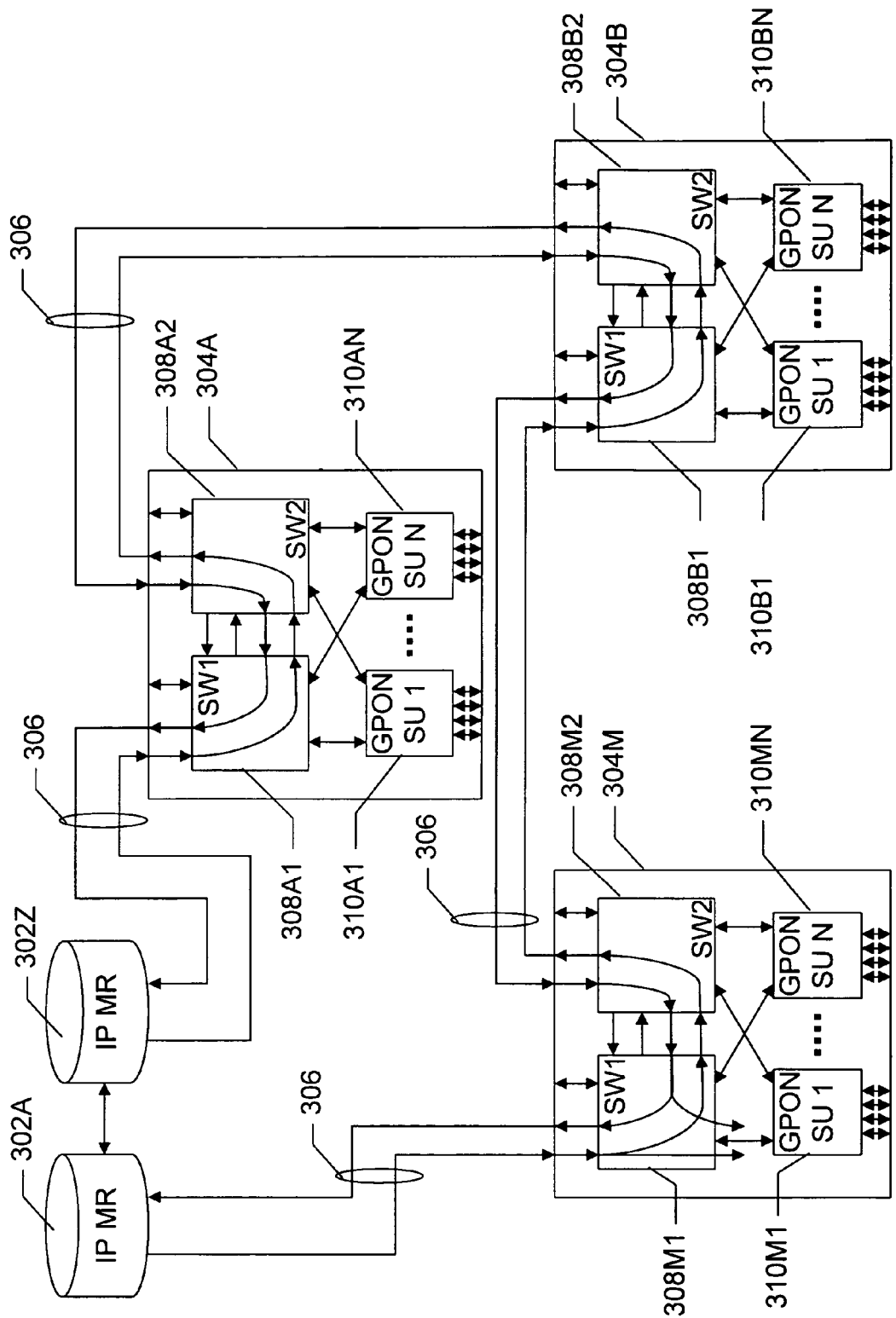
FIG. 3 is an exemplary block diagram of an OLT system in a network in which IP multi-cast video distribution may be implemented.

An exemplary block diagram of a system 300 in which IP multi-cast video distribution may be implemented is shown in FIG. 3. The example shown in FIG. 3 includes a plurality of IP multi-cast routers/servers 302A-Z, a plurality of GPON OLTs, such as GPON OLTs 304A-M, and may include other functions, such as SONET transport functions (nor shown). These elements are communicatively connected by a protected optical fiber ring 306. Protected optical fiber ring 306 typically includes at least two optical fibers, with data flowing in different directions around each fiber of the ring. Although ring 306 may include multiple transport technologies, in the example shown in FIG. 3, IP multi-cast router/servers 302A-Z are communicatively connected to GPON OLTs 304A-M via 10 Gigabit Ethernet (10 GE). Each GPON OLT includes at least two Ethernet switches and a plurality of GPON service units (SUs). For example, GPON OLT 304A includes Ethernet switches 308A1 and 308A2 and GPON SUs 310A1-N, GPON ONU 304B includes Ethernet switches 308B1 and 308B2 and GPON SUs 310B1-N, and GPON ONU 304M includes Ethernet switches 308M1 and 308M2 and GPON SUs 310M1-N.

The IP video is distributed from the IP Multi-cast routers/servers 302A-N in a two fiber like ring fashion. Each GPON ONU 304A-M provides an IP video drop-and-continue type function and is capable of providing path selection of traffic between the two rings. For example, Ethernet switches 308A1 and 308A2 simply forward the multi-cast data in both directions around the ring 306 (if none of their associated Service Units request these flows for their end users), while Ethernet switches 308M1 and 308M2 forward the multi-cast data in both directions around the ring 306, but also distribute the data to GPON SUs 310M1-N for distribution to end users.

The architecture shown in FIGS. 2 and 3 provides the benefits of using a lower number of expensive router 10 GE interfaces for multiple OLT shelves and the IP Multi-cast router protection.

The IGMP is using the two rings for message exchange and since the downstream requests are mainly broadcast it fits well with this architecture. The upstream IGMP membership requests are inserted in both directions of the ring, but since the upstream IGMP protocol requires a relatively very small bandwidth in comparison with the downstream flows, a small amount of bandwidth for upstream flows should be allowed for to avoid ring congestion. Alternatively, if 10 G is sufficient bandwidth to send the entire ensemble of possible multicast flows—no IGMP messages between OLT's and multi-cast routers will be needed. Also—the ends of the rings can either be sent to the alternate IP router, or to the same router that originated the ring. In the event that the IP Routers will fail to understand receiving the downstream flows on the direction back to the router, then the last OLT in the ring should be programmed to NOT continue these flows back to the IP multi-cast router.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A system for distributing multi-cast data traffic comprising:
    a multi-cast data source;
    a plurality of multi-cast data destinations units, each destination unit coupled to plural rings networks; and
    a data distribution network communicatively connecting the multi-cast data source to the plurality of multi-cast data destinations, the data distribution network comprising a first ring network communicatively connecting the multi-cast data source to a first one of the plurality of multi-cast data destinations, connecting each one of the plurality of multi-cast data destinations to a subsequent one the plurality of multi-cast data destinations, and connecting a last one of the plurality of multi-cast data destinations to the multi-cast data source, and a second ring network communicatively connecting the multi-cast data source to the last one of the plurality of multi-cast data destinations, connecting each one of the plurality of multi-cast data destinations to a previous one the plurality of multi-cast data destinations, and connecting the first one of the plurality of multi-cast data destinations to the multicast data source, wherein data flows in different directions in the first and second ring networks;
    a conversion unit for converting multi-cast data in a first format on the first ring network to multi-cast data in a second format on the second ring network.

2. The system of claim 1, wherein the multi-cast data source comprises at least one of a multi-cast router and a multi-cast server.

3. The system of claim 2, wherein each of the plurality of multi-cast data destinations comprise:

a first network switch having an interface to the first ring network and the second ring network, an interface to a second network switch, and an interface to at least one optical network service unit, the first network switch operable to receive multi-cast data from the first ring network, transmit the received first ring network multi-cast data to the second network switch, and transmit the received first ring network multi-cast data to the at least one optical network service unit, and to receive multi-cast data from the second network switch, transmit the multi-cast data received from the second network switch to the second ring network, and transmit the multicast data received from the second network switch to the at least one optical network service unit; and the second network switch having an interface to the first ring network and the second ring network, an interface to the first network switch, and an interface to at least one optical network service unit, the second network switch operable to receive multi-cast data from the second ring network, transmit the received second ring network multi-cast data to the first network switch, and transmit the received second ring network multi-cast data to the at least one optical network service unit, and to receive multi-cast data from the first network switch, transmit the multi-cast data received from the first network switch to the first ring network, and transmit the multi-cast data received from the first network switch to the at least one optical network service unit.

4. The system of claim 3, wherein each of the plurality of optical network service units comprises an interface to a passive optical network.

5. The system of claim 4, wherein the passive optical network is a Gigabit passive optical network.

6. The system of claim 3, wherein the first and second ring networks are 10 Gigabit Ethernet networks.

7. The system of claim 6, wherein the first and second network switches are Ethernet switches.

8. The system of claim 7, wherein the interfaces to the first and second ring networks are 10 Gigabit Ethernet interfaces.

* * * * *